United States Patent
Apostolescu et al.

(10) Patent No.: US 9,281,746 B1
(45) Date of Patent: Mar. 8, 2016

(54) SYSTEM AND METHOD FOR A DIAGNOSTIC CIRCUIT

(71) Applicant: Infineon Technologies AG, Neubiberg (DE)

(72) Inventors: Mihai-Nicolae Apostolescu, Bucharest (RO); Ansgar Pottbaecker, Grafing (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/520,111

(22) Filed: Oct. 21, 2014

(51) Int. Cl.
  *G05F 1/573* (2006.01)
  *H02M 3/158* (2006.01)

(52) U.S. Cl.
  CPC .................... *H02M 3/158* (2013.01)

(58) Field of Classification Search
  CPC ........................................ H02M 3/158
  USPC ............................................. 323/277
  See application file for complete search history.

(56) References Cited

U.S. PATENT DOCUMENTS

| | | | | |
|---|---|---|---|---|
| 4,375,073 A * | 2/1983 | Glogolja et al. | ............. | 361/91.4 |
| 5,886,510 A * | 3/1999 | Crespi et al. | ................... | 323/273 |
| 7,180,278 B2 * | 2/2007 | Tai et al. | ....................... | 323/280 |
| 8,174,269 B2 * | 5/2012 | Eom et al. | ..................... | 324/418 |
| 2005/0083086 A1 * | 4/2005 | Horn | ............................. | 327/108 |
| 2013/0176651 A1 * | 7/2013 | Burnham et al. | ............... | 361/56 |
| 2013/0320903 A1 * | 12/2013 | Aalund et al. | ................ | 318/490 |

OTHER PUBLICATIONS

Unknown Author, Figure submitted herewith and entitled "Independent High Side and Low Side Diagnostic Circuit", predates Oct. 21, 2013.

* cited by examiner

*Primary Examiner* — Jue Zhang
(74) *Attorney, Agent, or Firm* — Slater & Matsil, L.L.P.

(57) ABSTRACT

According to an embodiment, a diagnostic circuit is configured to be coupled to an output terminal of a switching circuit and to a sense terminal of a sense circuit coupled in parallel with the switching circuit. The diagnostic circuit includes a configurable feedback circuit configured to be coupled to the output terminal and the sense terminal. The configurable feedback circuit is configured to receive a select signal, switch a configuration of the configurable feedback circuit between a first mode and a second mode based on the select signal, sink a current from the sense circuit in the first mode, source a current to the sense circuit in the second mode, and balance a voltage difference between the output terminal and the sense terminal in the first mode and in the second mode.

25 Claims, 10 Drawing Sheets

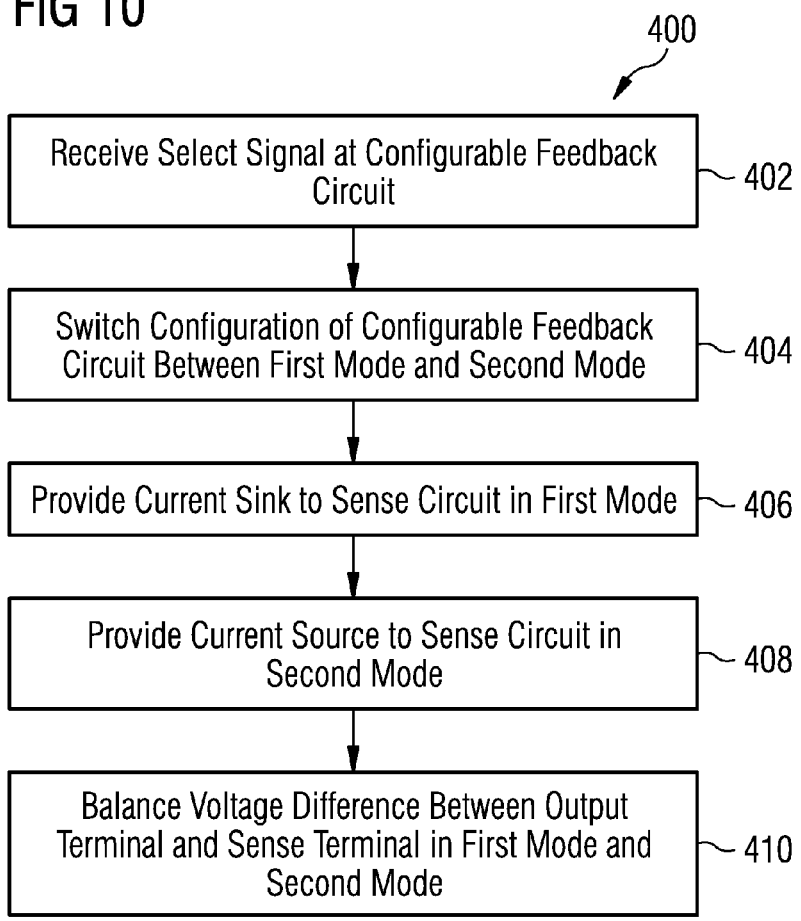

SYSTEM AND METHOD FOR A DIAGNOSTIC CIRCUIT

TECHNICAL FIELD

The present invention relates generally to electronic circuits, and, in particular embodiments, to a system and method for a diagnostic circuit.

BACKGROUND

Switching configurations such as, e.g., power supply systems are pervasive in many electronic applications from computers to automobiles. Generally, voltages within a power supply system are generated by performing a DC-DC, DC-AC, and/or AC-DC conversion by operating a switch loaded with an inductor or transformer. In some power supply systems, combinations of switches are arranged in a bridge configuration such as a half-bridge, full-bridge, or a multi-phase bridge. When very high voltages are generated by the power supply, it is beneficial to use switches that have both a high breakdown voltage and a low on-resistance.

In high current bridge configuration applications, electronic switches may be used to couple a load to a high-side or a low-side supply line. Mostly, n-channel power MOSFETs are used as switches in such applications, but other kinds of switches are possible as well. In order to be able to drive the gates and the gate charges of these switches very fast, so called bridge driver integrated circuits (ICs) are used. An alternating switching of the high-side and low-side switches is achieved by using a pulse width modulated (PWM) signal, which defines the load current at the output of the bridge with its duty cycle.

During the operation of such bridge drivers, the current flowing through the electronic switches may be measured using a current monitor circuit coupled to the bridge circuit. The output of the current monitor circuit may be used to shut down the bridge driver upon detection of an overcurrent condition such as a short circuit.

SUMMARY

According to an embodiment, a diagnostic circuit is configured to be coupled to an output terminal of a switching circuit and to a sense terminal of a sense circuit coupled in parallel with the switching circuit. The diagnostic circuit includes a configurable feedback circuit configured to be coupled to the output terminal and the sense terminal. The configurable feedback circuit is configured to receive a select signal, switch a configuration of the configurable feedback circuit between a first mode and a second mode based on the select signal, sink a current from the sense circuit in the first mode, source a current to the sense circuit in the second mode, and balance a voltage difference between the output terminal and the sense terminal in the first mode and in the second mode.

BRIEF DESCRIPTION OF THE DRAWINGS

For a more complete understanding of the present invention, and the advantages thereof, reference is now made to the following descriptions taken in conjunction with the accompanying drawings, in which:

FIG. 10 illustrates a block diagram of a method of operation for a switching circuit.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
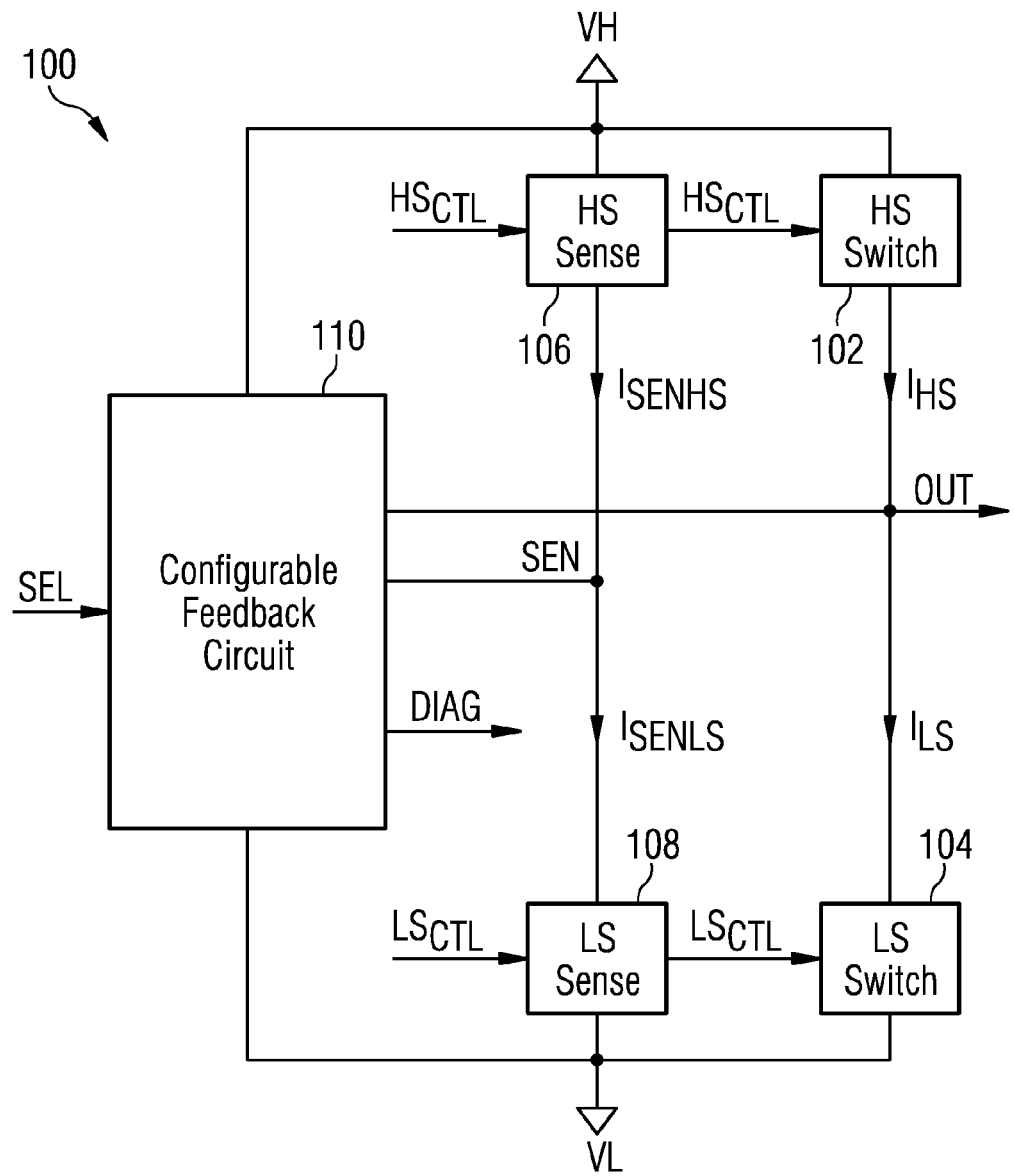
FIG. 1 illustrates a system block diagram of an embodiment half-bridge switching circuit.

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely switching circuits, and more particularly, half-bridge switching circuits. Some of the various embodiments described herein include current measurement and diagnostic circuits for half-bridge switching circuits, shared high side and low side diagnostic circuits, and configurable feedback circuits for measurement circuits in a half-bridge switching configuration. In other embodiments, aspects may also be applied to other applications involving any type of feedback, measurement, or diagnostic circuit according to any fashion as known in the art.

A half-bridge switching circuit includes a high-side power transistor and a low-side power transistor coupled in series between high and low supply terminals. In such configurations, the high-side and low-side power transistors may be switched alternatingly to supply an output terminal coupled to a load. According to an embodiment, a diagnostic circuit is coupled to the half-bridge switching circuit in order to monitor a load current flowing through the high-side power transistor and the low-side power transistor. The diagnostic circuit includes a high-side sense transistor and a low-side sense transistor. The high-side and low-side sense transistors are of a same type as the corresponding power transistors and receive the same respective control signals, but may be smaller in size. For example, the sense transistors may have dimensions that range from $\frac{1}{1000}^{th}$ to $\frac{1}{5000}^{th}$ of the dimensions of the power transistors.

In such embodiments, the high-side power transistor and the low-side power transistor may be operated such that both power transistors are not simultaneously in the on-state, or simultaneously conducting, thereby avoiding a short circuit path between the high supply terminal and the low supply terminal. Based on this operational approach, the diagnostic circuit further includes a configurable feedback circuit that controls a current through the active sense transistor, either high-side or low-side, in such way that the voltage drop over the active sense transistor and the active power transistor is substantially equal. In such embodiments, the current through the active sense transistor and the active power transistor may be proportional to the ratio of the size of the sense transistor and the power transistor. Based on the power transistor and sense transistor that are active, either high-side or low-side, the feedback loop is configured to switch between sourcing and sinking a feedback current. Further, the feedback loop may increase and decrease the feedback current depending on the voltage difference between the output terminal and a sense terminal that is between the high-side and low-side sense transistors. Based on the increasing and decreasing of the feedback current, the voltage difference between the output terminal and the sense terminal may be balanced or substantially zeroed.

In an embodiment, the diagnostic circuit generates a diagnostic signal proportional to the current flowing through the active power transistor. The diagnostic signal is generated based on the current flowing through the active sense transistor. The diagnostic circuit uses the diagnostic signal to generate an overcurrent signal, open load signal, or a diagnostic mirrored current proportional to the current flowing in the active power transistor. According to various embodiments described herein, the diagnostic circuit operates for both the high-side and low-side power transistors and includes a single sense amplifier coupled to the output terminal between the high-side and low-side power transistors and coupled to the sense terminal between the high-side and low-side sense transistors.

FIG. 1 illustrates a system block diagram of an embodiment half-bridge switching circuit 100 including configurable feedback circuit 110 coupled to high-side switch 102, low-side switch 104, high-side sense circuit 106, and low-side sense circuit 108. According to various embodiments, configurable feedback circuit 110 is coupled to output terminal OUT and sense terminal SEN and operates to substantially zero a voltage difference between output terminal OUT and sense terminal SEN. In various embodiments, high-side switch 102 and low-side switch 104 are alternatingly controlled by high-side control HSCTL and low-side control LSCTL to conduct high-side and low-side currents IHS and ILS from high supply voltage VH and low supply voltage VL, respectively, to output terminal OUT. Similarly, high-side sense circuit 106 and low-side sense circuit 108 are also controlled by high-side control HSCTL and low-side control LSCTL to conduct high-side and low-side sense currents ISENHS and ISENLS that are proportional to high-side and low-side currents IHS and ILS.

According to various embodiments, configurable feedback circuit 110 operates to zero the voltage difference between output terminal OUT and sense terminal SEN by adjusting the current sinking of high-side sense current ISENHS and adjusting the current sourcing of low-side sense current ISENLS. In such embodiments, configurable feedback circuit 110 is controlled be select signal SEL to switch between sinking high-side sense current ISENHS at sense terminal SEN when high-side switch 102 and high-side sense circuit 106 are conducting and sourcing low-side sense current ISENLS at sense terminal SEN when low-side switch 104 and low-side sense circuit 108 are conducting.

In various embodiments, configurable feedback circuit 110 also generates a diagnostic output DIAG that is related to the sense current, either high-side or low-side, and, consequently, to the main current at output terminal OUT, either high-side or low-side. In some embodiments, diagnostic output DIAG is a digital signal indicating that the main current is above or below a certain threshold. In still further embodiments, diagnostic output DIAG is a combination of analog and digital signals. In one specific embodiment, diagnostic output DIAG may be an output control signal for controlling further diagnostic circuits. In some specific embodiments, configurable feedback circuit 110 is implemented with a single sense amplifier. In a more specific embodiment, the single sense amplifier is an operational transconductance amplifier (OTA). Further detailed implementations of various configurable feedback circuits are described below in reference to the other figures.

Figure 2:
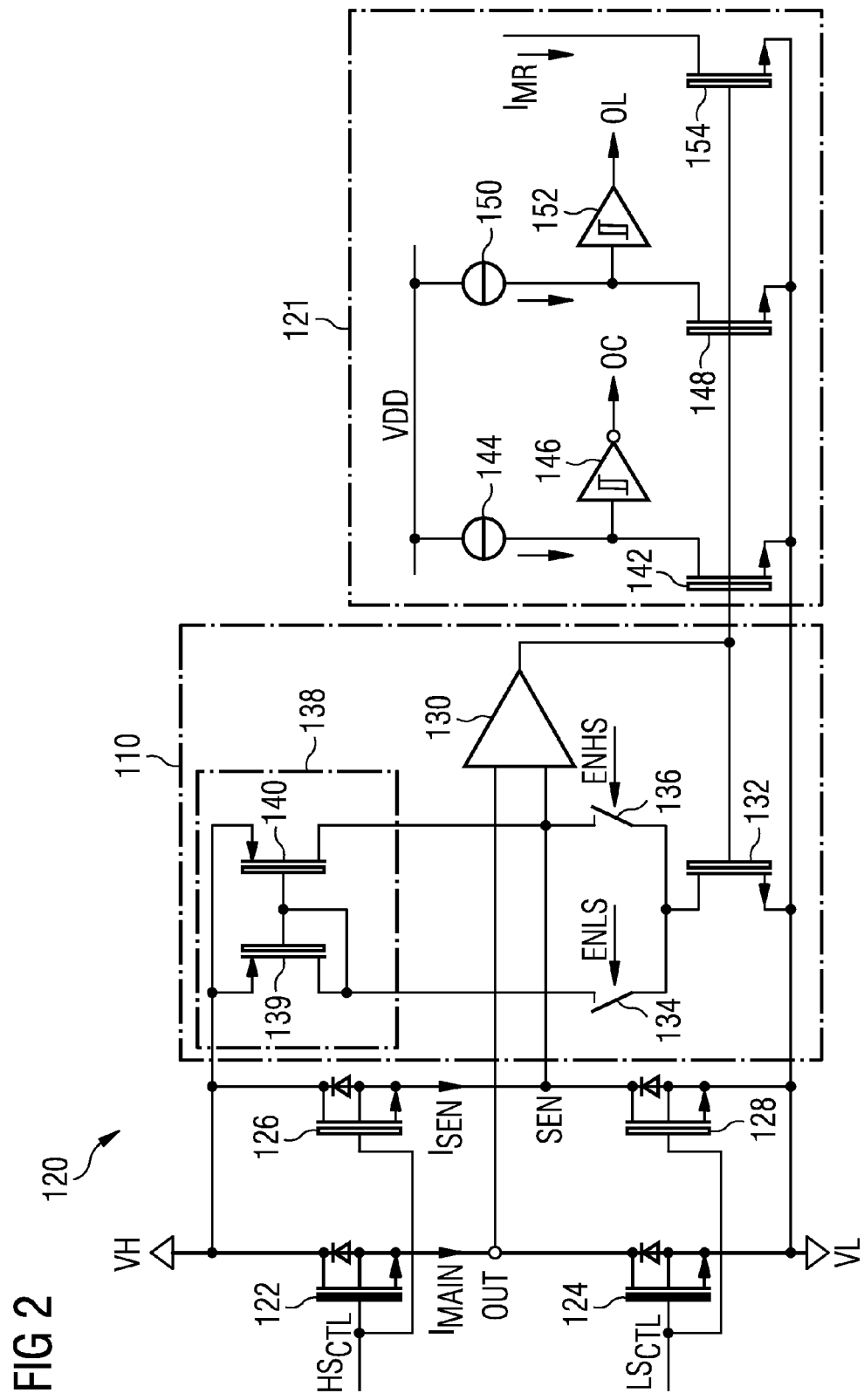
FIG. 2 illustrates a schematic diagram of another embodiment half-bridge switching circuit.

FIG. 2 illustrates a schematic diagram of another embodiment half-bridge switching circuit 120 including high-side transistor 122, low-side transistor 124, high-side sense transistor 126, low-side sense transistor 128, sense amplifier 130, sense feedback transistor 132, and diagnostic circuit 121. According to various embodiments, high-side transistor 122 and low-side transistor 124 are alternatingly switched on and off based on high-side control HSCTL and low-side control LSCTL. High-side sense transistor 126 and low-side sense transistor 128 are also controlled to switch on and off based on high-side control HSCTL and low-side control LSCTL. Sense amplifier 130 has differential inputs coupled to output terminal OUT and sense terminal SEN.

In various embodiments, current minor 138, including transistors 139 and 140, in combination with switches 134 and 136 and sense feedback transistor 132 are controlled to either sink or source sense current ISEN. When enable low-side ENLS is active and switch 134 is closed, current mirror 138 provides a source for sense current ISEN through low-side sense transistor 128. Conversely, when enable high-side ENHS is active and switch 136 is closed, current mirror 138 is disconnected and sense feedback transistor 132 provides a sink for sense current ISEN. In various embodiments, high-side transistor 122 and enable high-side ENHS are not controlled to enter a conducting states at the same time as low-side transistor 124 and enable low-side ENLS. Regardless of which transistor is conducting, either high-side transistor 122 or low-side transistor 124, sense amplifier 130 controls sense feedback transistor 132 based on the voltage difference between output terminal OUT and sense terminal SEN. Based on the control of sense amplifier 130, sense feedback transistor 132 is controlled to increase or decrease sense current ISEN in order to minimize the voltage difference between output terminal OUT and sense terminal SEN. In one embodiment, configurable feedback circuit 110, as described in reference to FIG. 1, includes elements 130, 132, 134, 136, 139, and 140 as shown in FIG. 2.

According to various embodiments, sense amplifier 130 is implemented using an operational transconductance amplifier (OTA). High-side transistor 122 and low-side transistor 124 may each be power transistors. In particular, high-side transistor 122 and low-side transistor 124 may each be a high voltage n-type metal-oxide-semiconductor (NMOS) power transistor. In other embodiments, high-side transistor 122 and low-side transistor 124 may be other types of transistors. In some embodiments, the proportionality of main current IMAIN to sense current ISEN may be determined by the ratio of the sizes of the respective high-side or low-side transistors. In such embodiments, the ratio of sizes between high-side transistor 122 and high-side sense transistor 126 may be between 1:1000 and 1:5000 and the ratio of sizes between low-side transistor 124 and low-side sense transistor 128 may also be between 1:1000 and 1:5000. In other embodiments, the ratios of sizes may be outside this range.

According to various embodiments, diagnostic circuit 121 includes transistors 142, 148, and 154, which are all controlled by the same output of sense amplifier 130 as sense feedback transistor 132. Consequently, transistors 142, 148, and 154 all generate currents proportional to sense current ISEN and main current IMAIN. Specifically, transistor 142 is controlled by sense amplifier 130 and, through comparison with an overcurrent threshold provided by current source 144, generates an overcurrent signal OC with inverting Schmitt-Trigger 146. Similarly, transistor 148 is controlled by sense amplifier 130 and, through comparison with an open load threshold provided by current source 150, generates an open load signal OL with non-inverting Schmitt-Trigger 152. Further, transistor 154 is also controlled by sense amplifier 130 and generates minor current IMR that is proportional to main current IMAIN.

Figure 3:
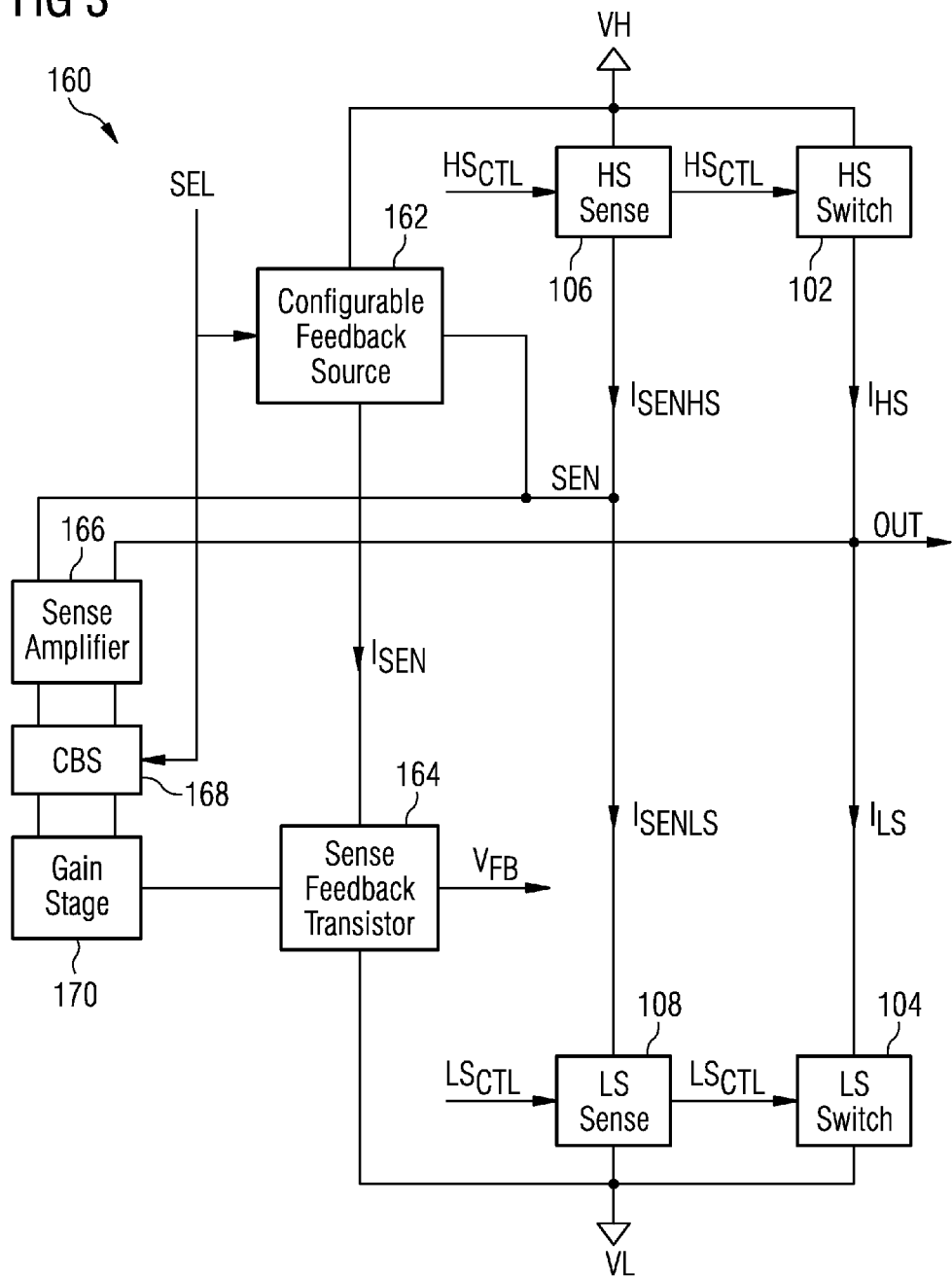
FIG. 3 illustrates a system block diagram of a further embodiment half-bridge switching circuit.

FIG. 3 illustrates a system block diagram of a further embodiment half-bridge switching circuit 160 including high-side switch 102, low-side switch 104, high-side sense circuit 106, low-side sense circuit 108, configurable current source 162, sense feedback transistor 164, sense amplifier 166, crossbar switch (CBS) 168, and gain stage 170. According to an embodiment, half-bridge switching circuit 160 operates in a similar manner as half-bridge switching circuit 100 by operating to substantially zero a voltage difference between output terminal OUT and sense terminal SEN. In various embodiments, high-side switch 102 and low-side switch 104 are alternatingly controlled by high-side control HSCTL and low-side control LSCTL to conduct high-side and low-side currents IHS and ILS from high supply voltage VH and low supply voltage VL, respectively, to output terminal OUT. Similarly, high-side sense circuit 106 and low-side sense circuit 108 are also controlled by high-side control HSCTL and low-side control LSCTL to conduct high-side and low-side sense currents ISENHS and ISENLS that are proportional to high-side and low-side currents IHS and ILS.

In various embodiments, sense amplifier 166 receives differential inputs from output terminal OUT and sense terminal SEN and generates a differential output. CBS 168 receives the differential output and, based on select signal SEL, configures a coupling between gain stage 170 and the differential output from sense amplifier 166. Based on select signal SEL, CBS 168 switches the polarity of the coupling between sense amplifier 166 and gain stage 170. Select signal SEL also controls configurable current source 162 to switch between sinking high-side sense current ISENHS when high-side switch 102 and high-side sense circuit 106 are in a conducting state and sourcing low-side sense current ISENLS when low-side switch 104 and low-side sense circuit 108 are in a conducting state. Thus, in various embodiments, configurable current source 162 provides sense current ISEN, which is either high-side sense current ISENHS or low-side sense current ISENLS, to sense feedback transistor 164 depending on select signal SEL. Simultaneously, gain stage 170 provides a control signal for sense feedback transistor 164 that increases or decreases the sense current ISEN based on the voltage difference between output terminal OUT and sense terminal SEN received at the differential input of sense amplifier 166.

According to various embodiments, high-side switch 102, high-side sense circuit 106, and configurable current source 162 are supplied by high supply voltage VH, and low-side switch 104, low-side sense circuit 108, and sense feedback transistor 164 are supplied by low supply voltage VL. In other embodiments, configurable current source 162 or sense amplifier 166 may be coupled to another voltage supply, such as a charge pump voltage, for example. Further, other embodiments may include other voltage supplies. Via sense feedback transistor 164, an output signal or feedback voltage VFB is generated that may be used for overcurrent detection, open load detection, current mirroring, or other diagnostics, as described further herein in reference to the other figures.

Figure 4:
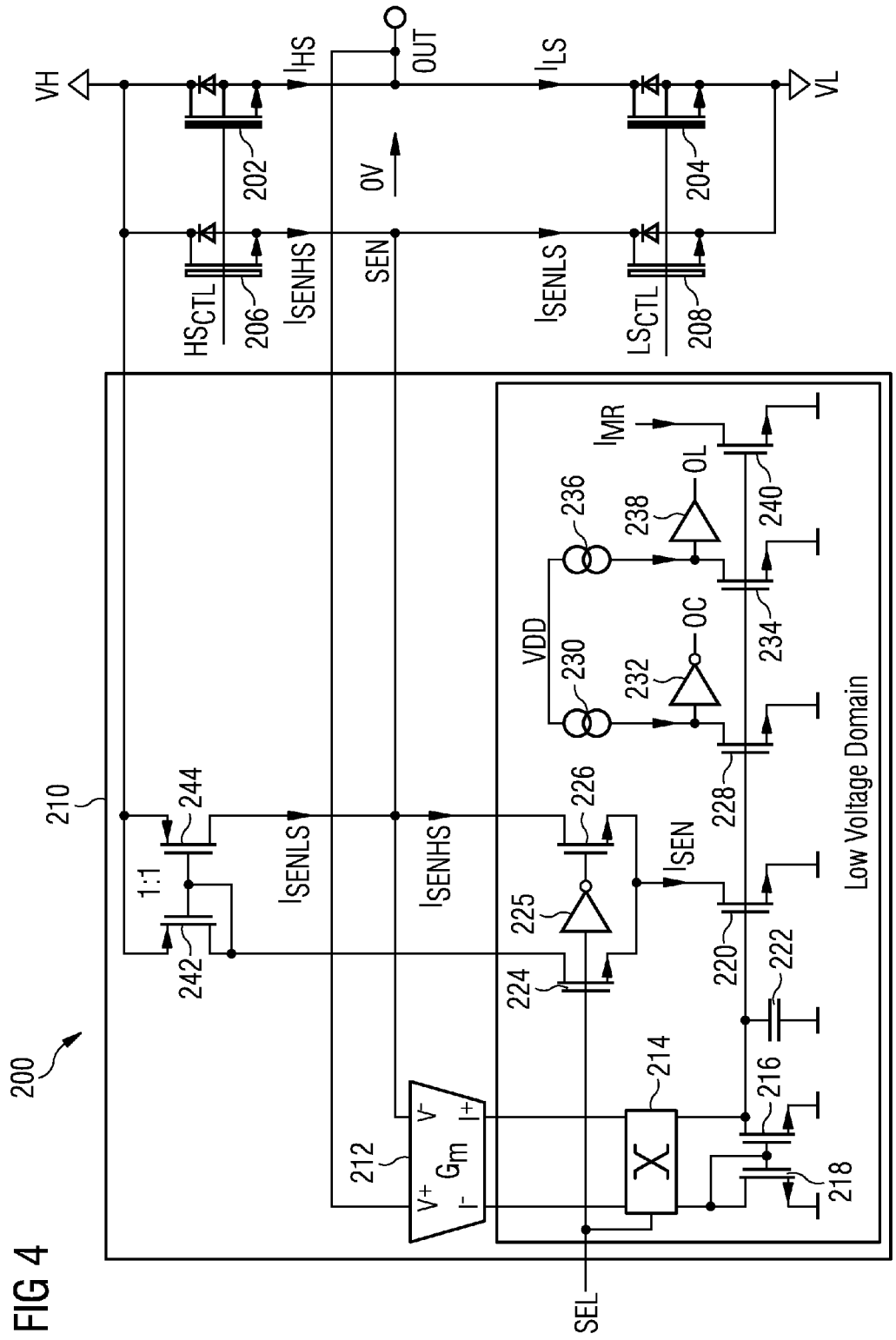
FIG. 4 illustrates a schematic diagram of yet another embodiment half-bridge switching circuit.

FIG. 4 illustrates a schematic diagram of yet another embodiment half-bridge switching circuit 200 including high-side power transistor 202, low-side power transistor 204, high-side sense transistor 206, low-side sense transistor 208, and diagnostic circuit 210. According to various embodiments, high-side power transistor 202 and low-side power transistor 204 are connected in series between high supply voltage VH and low supply voltage VL. High-side and low-side power transistors 202 and 204 are controlled by high-side control HSCTL and low-side control LSCTL to alternatingly switch between supplying output terminal OUT with high supply voltage VH and low supply voltage VL. During operation of high-side and low-side power transistors 202 and 204, high-side and low-side sense transistors 206 and 208 are also controlled by high-side control HSCTL and low-side control LSCTL in order to generate sense currents proportional to high-side current IHS flowing through high-side power transistor 202 and low-side current ILS flowing through low-side power transistor 204. The sense currents include high-side sense current ISENHS flowing through high-side sense transistor 206 and low-side sense current ISENLS flowing through low-side sense transistor 208.

In various embodiments, diagnostic circuit 210 is coupled to sense terminal SEN and output terminal OUT and provides current feedback control and diagnostic functions. Diagnostic circuit 210 may operate to determine an overcurrent condition, determine an open load condition, generate a minor current IMR proportional to high-side or low-side currents IHS and ILS, or perform other diagnostic functions.

According to an embodiment, diagnostic circuit 210 includes sense amplifier 212 that has differential inputs connected to sense terminal SEN and output terminal OUT and differential outputs connected to crossbar switch (CBS) 214. CBS 214 is controlled by select signal SEL, in a similar manner as CBS 168 as described in reference to FIG. 3, in order to switch the polarity of the coupling between the differential outputs of sense amplifier 212 and a gain stage formed by transistors 216 and 218. An output of the gain stage formed by transistors 216 and 218 controls sense feedback transistor 220. Based on the voltage difference received at the differential input of sense amplifier 212, which is dependent on the voltage difference between output terminal OUT and sense terminal SEN, the gain stage formed by transistors 216 and 218 controls sense feedback transistor 220 in order to increase or decrease the current drawn through either transistor 224 or transistor 226, which are linked to control the sense current ISEN flowing in either high-side sense transistor 206 (ISENHS) or low-side sense transistor 208 (ISENLS). In some embodiments, this configuration balances the voltage difference between output terminal OUT and sense terminal SEN, in order to substantially zero the voltage difference, by adjusting the sense current ISEN drawn through either high-side sense transistor 206 (ISENHS) or low-side sense transistor 208 (ISENLS). Compensation is provided through compensation capacitor 222.

In various embodiments, high-side control HSCTL and low-side control LSCTL are operated to control high-side power transistor 202 and low-side power transistor 204 such that both power transistors are not operated in a conducting state simultaneously. High-side and low-side sense transistors 206 and 208 are controlled to be operated in a conducting state at the same time as the respective high-side or low-side power transistor 202 and 204. In such embodiments, it may be the case that only one of the sense currents is flowing at a specific instant. Based on this operation, diagnostic circuit 210 may be operated to provide a current sink for high-side sense current ISENHS or a current source for low-side sense current ISENLS based on select signal SEL, which may be operated to correspond with high-side control HSCTL and low-side control LSCTL.

According to an embodiment, when high-side power transistor 202 is conducting, select signal SEL may turn transistor 226 on, or into a conducting state, and may turn transistor 224 off, or into a non-conducting state. When transistor 226 is turned on, high-side sense current ISENHS is conducted through transistor 226 and sense feedback transistor 220, which is controlled by sense amplifier 212 to increase or decrease high-side sense current ISENHS in order to substantially zero the voltage difference between output terminal OUT and sense terminal SEN. In such embodiments, sense feedback transistor 220 may be operated to control the level of high-side sense current ISENHS by directly controlling high-side sense current ISENHS drawn through sense feedback transistor 220.

Similarly, according to a further embodiment, when low-side power transistor 204 is conducting, select signal SEL may turn transistor 224 on, or into a conducting state, and may turn transistor 226 off, or into a non-conducting state. When transistor 224 is turned on, low-side sense current ISENLS is supplied by the current mirror formed by transistor 242 and 244. Through the current minor formed by transistor 242 and 244, low-side sense current ISENLS is mirrored and conducted through transistor 224 and sense feedback transistor 220, which is controlled by sense amplifier 212 to increase or decrease low-side sense current ISENLS in order to substantially zero the voltage difference between output terminal OUT and sense terminal SEN. In such embodiments, sense feedback transistor 220 may be operated to control the level of low-side sense current ISENLS by controlling the current minor formed by transistors 242 and 244 that supplies low-side sense current ISENLS.

In some embodiments, transistors 224 and 226 provide voltage domain isolation between a high voltage domain supplied by high supply voltage VH and a low voltage domain within portions of diagnostic circuit 210. In various embodiments, select signal SEL may operate to control transistors 224 and 226 inversely through inverter 225, which is coupled between control terminals of transistors 224 and 226.

According to various embodiments, while the gain stage formed by transistors 216 and 218 controls sense feedback transistor 220 to perform voltage balancing and to conduct sense current ISEN, the control signal from the gain stage formed by transistors 216 and 218 may also be provided to diagnostic elements. Specifically, transistor 228 receives the same control signal and, through comparison with an overcurrent threshold provided by current source 230, generates overcurrent signal OC with inverter 232. Similarly, transistor 234 receives the same control signal and, through comparison with an open load threshold provided by current source 236, generates open load signal OL with buffer 238. Further, transistor 240 also receives the same control signal and generates mirror current IMR.

In some embodiments, the specific transistor types illustrated are used. In other embodiments, any type of transistor may be used for the various transistors included in half-bridge switching circuit 200. Further, various voltage levels and supplies may also be included in the various embodiments.

Figure 5:
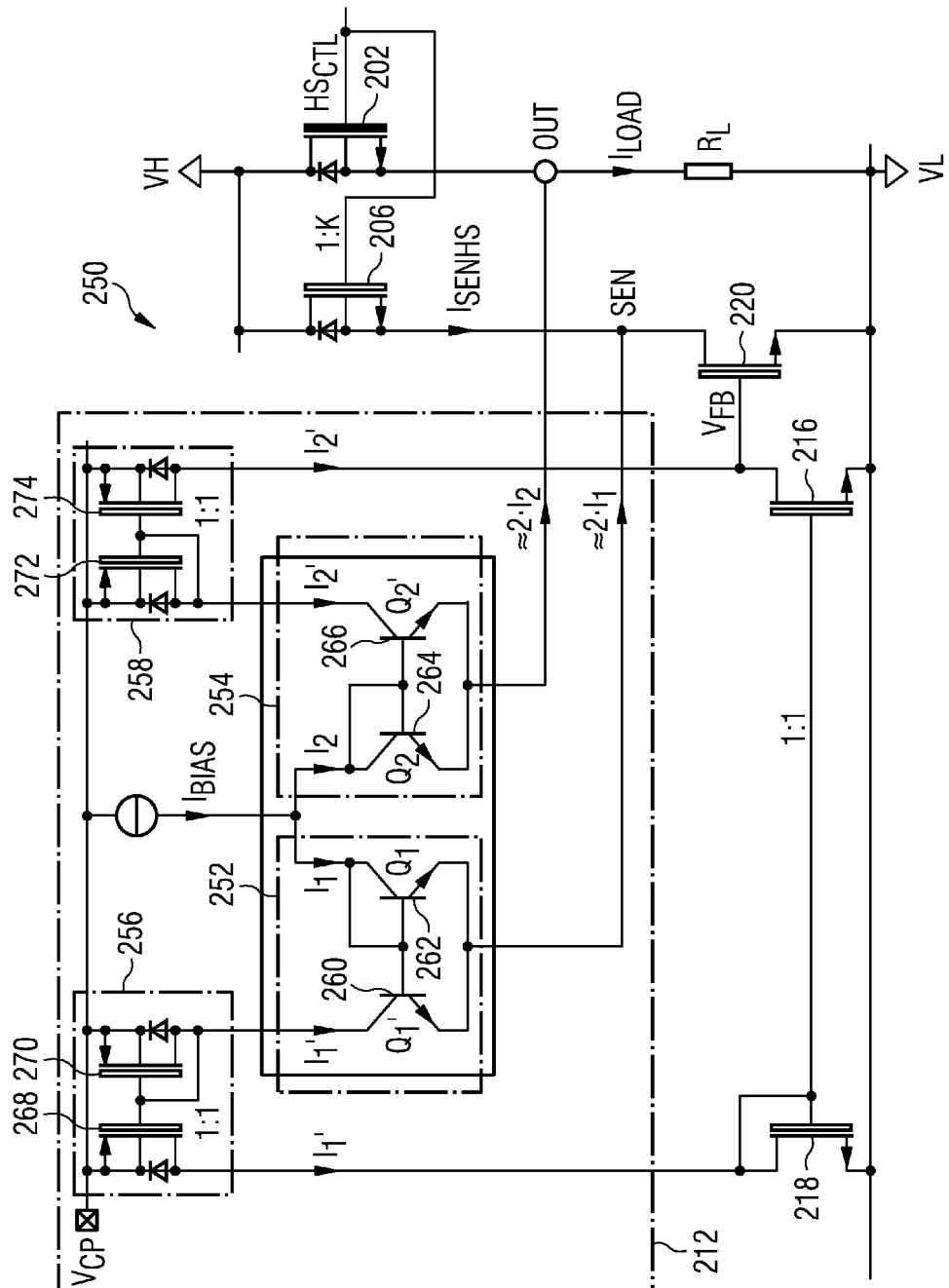
FIG. 5 illustrates a schematic diagram of an embodiment sense amplifier circuit.

FIG. 5 illustrates a schematic diagram of an embodiment sense amplifier circuit 250 according to a first configuration.

According to various embodiments, FIG. 5 illustrates high-side power transistor 202 and high-side sense transistor 206 turned on and sense amplifier circuit 250 is illustrated according to an embodiment configuration corresponding to high-side power transistor 202 being turned on. In various embodiments, low-side power transistor 204 and low-side sense transistor 208 may be included, but are unillustrated in FIG. 5 for simplicity because low-side power transistor 204 and low-side sense transistor 208 are turned off. Further, CBS 214 and transistors 224 and 226 are illustrated as short circuit connections for simplicity. In various embodiments, sense amplifier circuit 250 receives input common mode ranges that may exceed high supply voltage VH and low supply voltage VL. In a specific embodiment, charge pump voltage VCP is greater than high supply voltage VH.

According to various embodiments, sense amplifier circuit 250 includes sense amplifier 212, transistors 216 and 218, and sense feedback transistor 220, as described in reference to FIG. 4 hereinabove. High-side power transistor 202 may supply a load, modeled by resistor RL, coupled to output terminal OUT. High-side sense transistor 206 supplies high-side sense current ISENHS to sense feedback transistor 220, which is controlled by sense amplifier 212 and the gain stage formed by transistors 216 and 218. Sense amplifier 212 generates the control for the gain stage formed by transistors 216 and 218 based on the voltage difference between output terminal OUT and sense terminal SEN.

According to an embodiment, sense amplifier 212 includes first bipolar current mirror 252 including bipolar junction transistors (BJTs) 260 and 262; second bipolar current mirror 254 including BJTs 264 and 266; first current minor 256 including transistors 268 and 270; and second current minor 258 including transistors 272 and 274. First bipolar current minor 252 is controlled by the voltage on sense terminal SEN and second bipolar current mirror 254 is controlled by the voltage on output terminal OUT. First and second bipolar current minors 252 and 254 generate control currents that are then mirrored in first and second current mirrors 256 and 258, respectively, in order to supply transistors 218 and 216. As described previously hereinabove, transistors 218 and 216 operate as a gain stage to generate feedback voltage VFB to control sense feedback transistor 220, which then adjust high-side sense current ISENHS.

In some embodiments, sense amplifier 250 implemented in order to increase static and dynamic input common mode range. In a specific embodiment, a half-bridge configuration may receive input voltages ranging from one base-emitter voltage VBE below low supply voltage VL and one base-emitter voltage VBE above high supply VH.

In a specific embodiment, transistor 216, transistor 218, and sense feedback transistor 220 are metal-oxide-semiconductor (MOS) n-type field effect transistors (NFETs). In other embodiments, transistor 216, transistor 218, and sense feedback transistor 220 may be other types of transistors. Further, sense amplifier 212 is shown as a specific sense amplifier embodiment. In other embodiments, sense amplifier 212 may be implemented using other configurations for a sense amplifier including any types of transistors and corresponding circuit reconfigurations.

Figure 6:
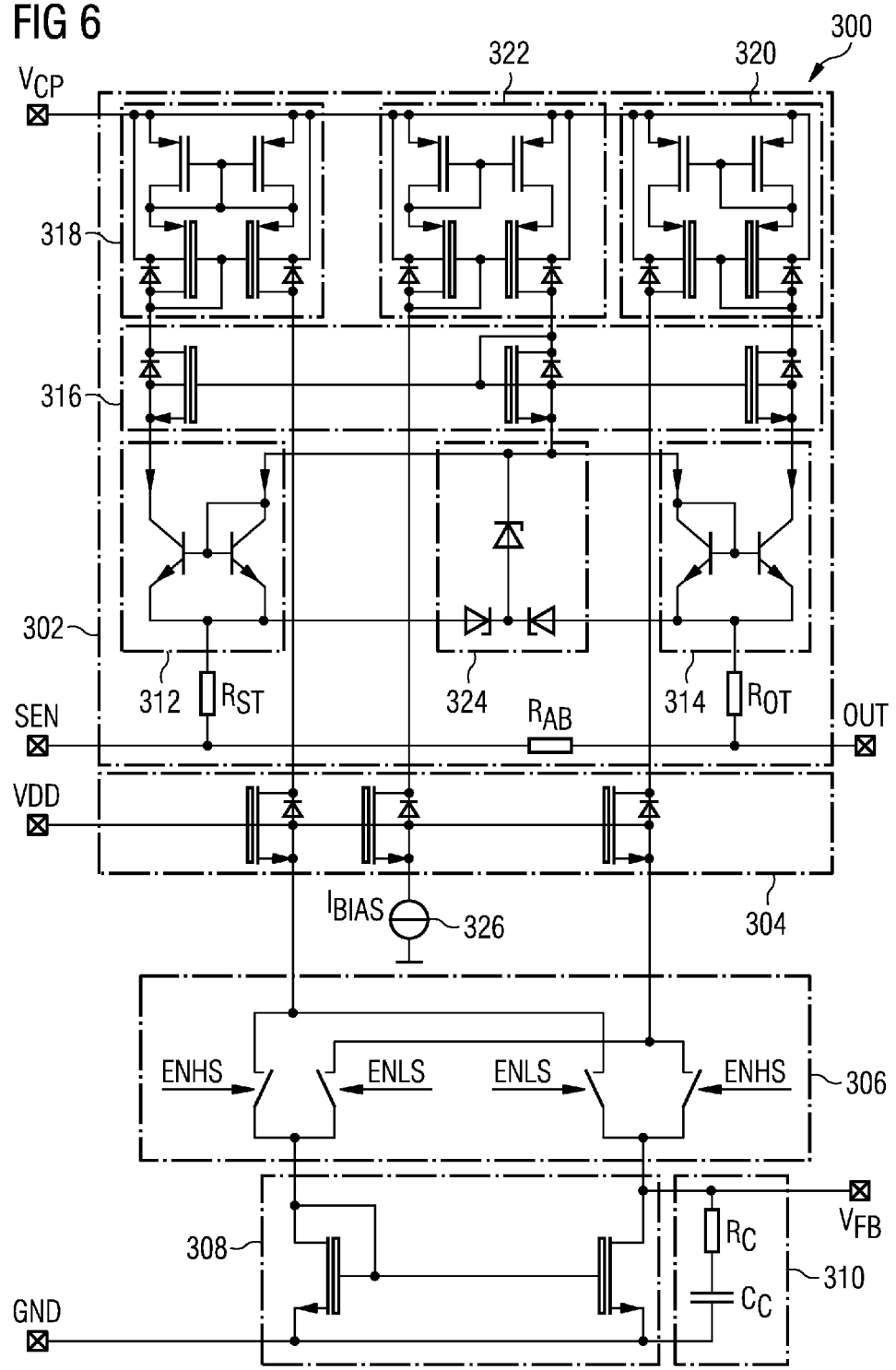
FIG. 6 illustrates a schematic diagram of an embodiment configurable feedback circuit.

FIG. 6 illustrates a schematic diagram of an embodiment configurable feedback amplifier 300 including sense amplifier 302, isolation elements 304, crossbar switch (CBS) 306, gain stage 308, and compensation circuit 310. According to various embodiments, sense amplifier 302 may operate in a similar manner as sense amplifiers 130, 166, or 212, as described above in reference to the other figures. Sense amplifier 302 receives differential inputs from output terminal OUT and sense terminal SEN, which may be coupled to a half-bridge switching circuit with sense transistors coupled in parallel with power transistors, and generates an amplified differential output that is supplied through gain stage 308 as feedback voltage VFB. In such embodiments, feedback voltage VFB may be coupled to a control terminal of a sense feedback transistor (not shown) as described in reference to the other figures.

In various embodiments, isolation elements 304 include transistors controlled by supply voltage VDD and provide voltage domain isolation between sense amplifier 302, which is supplied by charge pump voltage VCP, and CBS 306 and gain stage 308, which are low voltage components operated in the low voltage domain. In some embodiments, charge pump voltage VCP is larger than high supply voltage VH, which supplies the power transistors in the half-bridge switching circuit coupled to output terminal OUT.

In various embodiments, CBS 306 is controlled based on enable high-side ENHS and enable low-side ENLS in order to switch the polarity of the coupling between sense amplifier 302 and gain stage 308. In some embodiments, enable high-side ENHS and enable low-side ENLS are related to select signal SEL described in reference to the other figures. In a specific embodiment, SEL equal to binary 0 is equivalent to ENHS equal to binary 1 and ENLS equal to binary 0 and SEL equal to binary 1 is equivalent to ENHS equal to binary 0 and ENLS equal to binary 1.

In various embodiments, based on the differential output from sense amplifier 302 received through isolation elements 304 and CBS 306, gain stage 308 generates feedback voltage VFB. Compensation circuit 310 includes compensation resistor RC and compensation capacitor CC coupled between the node with feedback voltage VFB and ground terminal GND. In other embodiments, ground terminal GND may also be a low voltage supply terminal.

According to various embodiments, sense amplifier 302 includes bipolar current minors 312 and 314 coupled to sense terminal SEN through sense terminal resistor RST and coupled to output terminal OUT through output terminal resistor ROT, respectively. Bipolar current mirrors 312 and 314 are biased by current source 326 through current minor 322. In such embodiments, current source 326 is coupled to and supplied by a low voltage domain such as VDD or GND. Bipolar current mirrors 312 and 314 generate control output currents for current mirrors 318 and 320, respectively, which in turn supply mirrored currents to gain stage 308 through isolation elements 304 and CBS 306.

In various embodiments, isolation elements 316 are coupled between bipolar current minors 312 and 314 and current mirrors 318, 320, and 322 in order to reduce voltage requirements on the BJTs in bipolar current minors 312 and 314 and in order to reduce or cancel the Early effect. Further, voltage clamping element 324, which includes Zener diodes in one embodiment, is coupled to bipolar current minors 312 and 314 and decoupling elements 316 in order to clamp voltages applied to elements of sense amplifier 302 and prevent damage.

In various embodiments, balancing resistor RAB is coupled between output terminal OUT and sense terminal SEN and improves control of impedance at sense terminal SEN, which influences a secondary pole. The specific configuration of configurable feedback amplifier 300, including all the transistors types, is illustrated according to one embodiment. In other embodiments, other transistor types, elements, and circuit configurations are envisioned.

Figure 7:
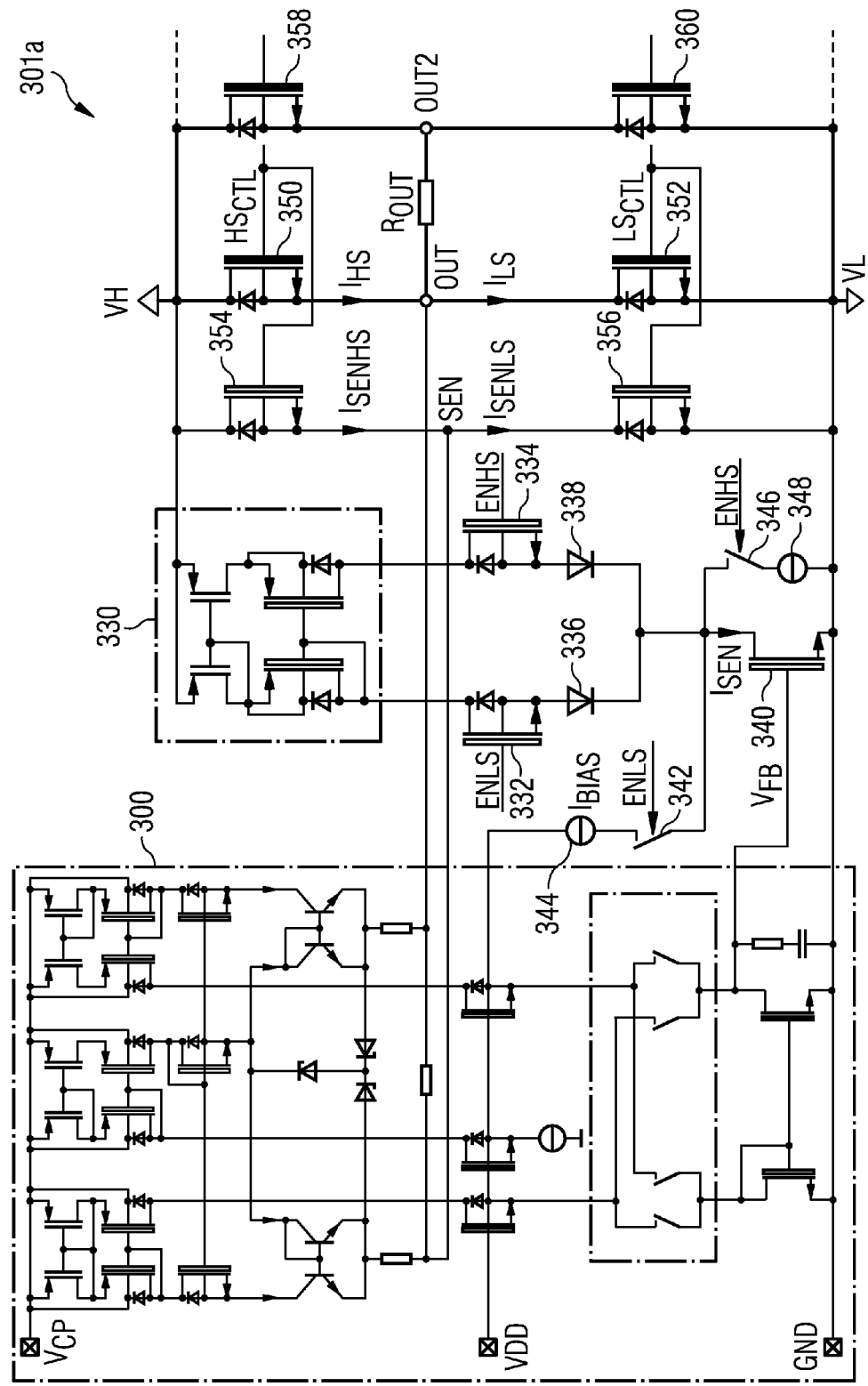
FIG. 7 illustrates a schematic diagram of a still further embodiment half-bridge switching circuit.

FIG. 7 illustrates a schematic diagram of a still further embodiment half-bridge switching circuit 301a including configurable feedback amplifier 300 coupled to output terminal OUT, sense terminal SEN, and sense feedback transistor 340. The description of configurable feedback amplifier 300 in reference to FIG. 6 is applicable for FIG. 7 and is not repeated in the interest of brevity. According to an embodiment, the half-bridge switching circuit including high-side power transistor 350 and low-side power transistor 352 is coupled through output resistor ROUT to a second half-bridge switching circuit including high-side power transistor 358 and low-side power transistor 360 in order to illustrate an example load path. In such an embodiment, half-bridge switching circuit 301a may be referred to as a full-bridge switching circuit; however, any type of load may be coupled to the half-bridge switching circuit including high-side power transistor 350 and low-side power transistor 352.

In various embodiments, high-side and low-side power transistors 350 and 352 along with high-side and low-side sense transistors 354 and 356 are controlled by high-side control HSCTL and low-side control LSCTL. The operation of the other elements illustrated in FIG. 7 is similar to the operations described in reference to FIGS. 1, 2, 3, and 4, for example, with increased detail. Accordingly, sense feedback transistor 340 is controlled by feedback voltage VFB to increase and decrease sense current ISEN in order to substantially zero the voltage difference between output terminal OUT and sense terminal SEN. According to various embodiments, based on enable high-side ENHS and enable low-side ENLS in combination with the switching state of high-side and low-side sense transistors 354 and 356, configurable feedback amplifier 300, sense feedback transistor 340 and current minor 330 operate to sink high-side sense current ISENHS or source low-side sense current ISENLS. In such embodiments, enable high-side ENHS and enable low-side ENLS control transistors 332 and 334 and switches 342 and 346 in order to configure current mirror 330 and sense feedback transistor 340 to provide a current sink (ISENHS) or a current source (ISENLS).

In various embodiments, current sources 344 and 348 provide compensation of the input current of sense amplifier 302 depending on high-side or low-side operation. Diodes 336 and 338 may protect against a reverse bias condition caused by drain-bulk diodes in transistors 332 and 334. In various other embodiments, alternative transistor types may be used instead of the transistor types illustrated. Further, some elements may be removed or rearranged in other embodiments.

Figure 8:
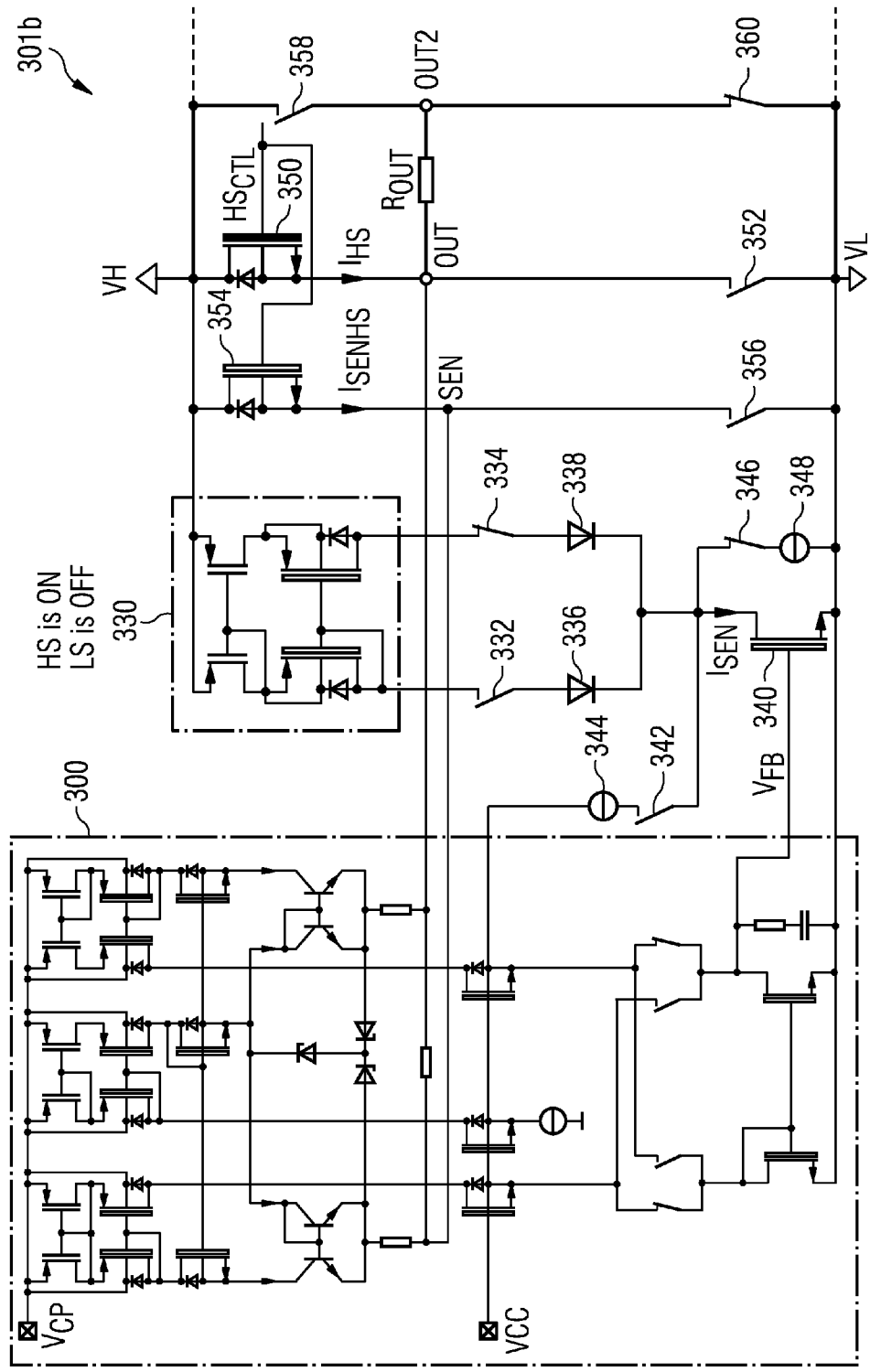
FIG. 8 illustrates a schematic diagram of the still further embodiment half-bridge switching circuit in a first configuration.

In order to further understanding, FIG. 8 illustrates a schematic diagram of the still further embodiment half-bridge switching circuit 301b in a first configuration where high-side power transistor 350 is in the on state corresponding to enable high-side ENHS set to ON, or binary 1, and high-side control HSCTL set to the on state. In such a configuration, low-side power transistor 352 is in the off state corresponding to enable low-side ENLS set to OFF, or binary 0, and low-side control LSCTL set to the off state. The various switches in the on state are illustrated as short circuit connections and the switches and transistors in the off state are illustrated as open circuit switches.

Figure 9:
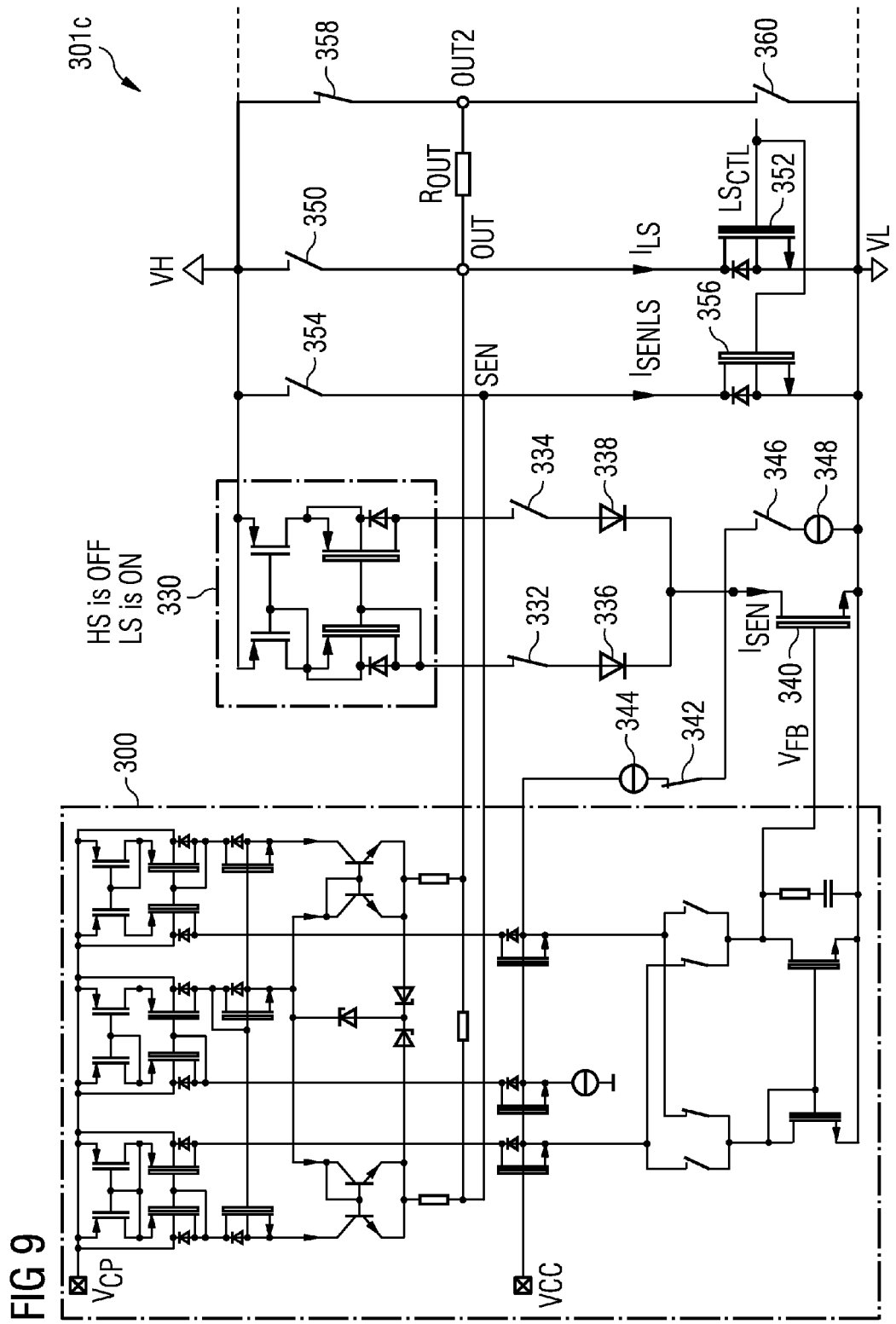
FIG. 9 illustrates a schematic diagram of the still further embodiment half-bridge switching circuit in a second configuration.

Further, FIG. 9 illustrates a schematic diagram of the still further embodiment half-bridge switching circuit 301c in a second configuration where low-side power transistor 352 is in the on state corresponding to enable low-side ENLS set to ON, or binary 1, and low-side control LSCTL set to the on state. In such a configuration, high-side power transistor 350 is in the off state corresponding to enable high-side ENHS set to OFF, or binary 0, and high-side control HSCTL set to the off state. Again, the various switches in the on state are illustrated as short circuit connections and the switches and transistors in the off state are illustrated as open circuit switches.

In the various illustrative embodiments described herein, specific transistor types and configurations are depicted in the figures. In other embodiments, other transistor types may be included. For example, embodiment circuits presented herein using primarily n-type transistors may be replaced with circuits using primarily p-type transistors. In such alternative embodiments, one of ordinary skill in the art will recognize that circuit and voltage supply configurations may be modified accordingly. In some embodiments, transistors depicted herein may be implemented as, for example, any type of field effect transistor (FET), such as metal-oxide-semiconductor FETs (MOSFETs), fin type FETs (FinFETs), or junction type FETs (JFETs), or as bipolar junction transistors (BJTs), or other device structures.

FIG. 10 illustrates a block diagram of method of operation 400, which includes steps 402-410, for a switching circuit. A sense circuit may be coupled in parallel with the switching circuit. According to various embodiments, step 402 includes receiving a select signal at a configurable feedback circuit coupled to the switching circuit and the sense circuit. Step 404 includes, based on the select signal, switching a configuration of the configurable feedback circuit between a first mode and a second mode. Step 406 includes providing a current sink to the sense circuit in the first mode and step 408 includes providing a current source to the sense circuit in the second mode. In the first mode and the second mode, step 410 includes balancing a voltage difference between an output terminal of the switching circuit and a sense terminal of the sense circuit. In various other embodiments, method 400 may include additional steps and may be rearranged according to another sequence.

According to an embodiment, a diagnostic circuit is configured to be coupled to an output terminal of a switching circuit and to a sense terminal of a sense circuit coupled in parallel with the switching circuit. The diagnostic circuit includes a configurable feedback circuit configured to be coupled to the output terminal and the sense terminal. The configurable feedback circuit is configured to receive a select signal, switch a configuration of the configurable feedback circuit between a first mode and a second mode based on the select signal, sink a current from the sense circuit in the first mode, source a current to the sense circuit in the second mode, and balance a voltage difference between the output terminal and the sense terminal in the first mode and in the second mode.

In various embodiments, the diagnostic circuit includes the switching circuit and the sense circuit. The switching circuit may be a half-bridge switching circuit including a high side transistor coupled to a high supply terminal and a low side transistor coupled to a low supply terminal. In such embodiments, the sense circuit may include a high side sense transistor and a low side sense transistor. The high side sense transistor is coupled to the high supply terminal and configured to receive a same first control signal as the high side transistor. The low side sense transistor coupled to the low supply terminal and configured to receive a same second control signal as the low side transistor. In some embodiments, the configurable feedback circuit includes a single sense amplifier with a first input configured to be coupled to the output terminal, a second input configured to be coupled to the sense terminal, and a first output configured to adjust current flowing in the sense circuit.

In various embodiments, the configurable feedback circuit is further configured to generate a diagnostic output signal proportional to a current flowing in the switching circuit in the first mode and in the second mode. In some embodiments, the diagnostic circuit also includes an overcurrent detection circuit coupled to the configurable feedback circuit and configured to generate a first minor current proportional to the current flowing in the switching circuit based on the diagnostic output signal, compare the first minor current to an overcurrent threshold, and generate an overcurrent signal based on comparing the first minor current to the overcurrent threshold. In additional embodiments, the diagnostic circuit also includes an open load detection circuit coupled to the configurable feedback circuit and configured to generate a first minor current proportional to the current flowing in the switching circuit based on the diagnostic output signal, compare the first minor current to an open load threshold, and generate an open load signal based on comparing the first minor current to the open load threshold.

In various embodiments, the configurable feedback circuit includes a sense amplifier with differential inputs configured to be coupled to the output terminal and the sense terminal. In such embodiments, the sense amplifier is configured to balance the voltage difference between the output terminal and the sense terminal and generate the diagnostic output signal. The sense amplifier may include an operational transconductance amplifier. The configurable feedback circuit may further include a current minor, select switches coupled to the current mirror and configured to receive the select signal, and a feedback transistor coupled to the select switches. The current mirror, select switches, and the feedback transistor are configured to switch the configuration of the configurable feedback circuit, provide the current sink, and provide the current source.

According to an embodiment, a method of operating a switching circuit with a sense circuit coupled in parallel with the switching circuit includes receiving a select signal at a configurable feedback circuit coupled to the switching circuit and the sense circuit and switching a configuration of the configurable feedback circuit between a first mode and a second mode based on the select signal. In such embodiments, the method of operation also includes sinking a current from the sense circuit in the first mode, sourcing a current to the sense circuit in the second mode, and balancing a voltage difference between an output terminal of the switching circuit and a sense terminal of the sense circuit in the first mode and the second mode.

In various embodiments, the method of operation further includes generating a diagnostic output signal proportional to a current flowing in the switching circuit in the first mode and the second mode. The method of operation may also include generating an overcurrent detection signal based on the diagnostic output signal and an overcurrent threshold. In some embodiments, the method of operation further includes generating an open load detection signal based on the diagnostic output signal and an open load threshold. The method of operation may further include generating a minor current proportional to a main current flowing in the switching circuit based on the diagnostic output signal. In various embodiments, balancing the voltage difference between the output terminal and the sense terminal includes substantially zeroing the voltage difference between the output terminal and the sense terminal.

According to an embodiment, a diagnostic circuit is configured to be coupled to an output terminal of a half-bridge switching circuit and to a sense terminal of a sense circuit coupled in parallel with the half-bridge switching circuit. The diagnostic circuit includes a sense amplifier, a gain stage, a crossbar switch, a configurable current source, and a feedback transistor. The sense amplifier includes a first sense input configured to be coupled to the output terminal and a second sense input configured to be coupled to the sense terminal. The gain stage is coupled to a first sense output of the sense amplifier and a second sense output of the sense amplifier. The crossbar switch is coupled between the sense amplifier and the gain stage and coupled to a select input, and is configured to switch the coupling of the sense amplifier and the gain stage based on the select input. The configurable current source is coupled to the sense terminal and the select input, and is configured to be controlled based on the select input. The feedback transistor has a conduction terminal coupled to the configurable current source and a control terminal coupled to an output of the gain stage. The output of the gain stage is proportional to a current flowing in the half-bridge switching circuit.

In various embodiments, the diagnostic circuit further includes the half-bridge switching circuit and the sense circuit. The sense amplifier may include a fully differential operational transconductance amplifier (OTA). In such embodiments, the fully differential OTA includes bipolar junction transistors (BJTs) configured as a first bipolar current minor coupled to the first sense input and a second bipolar current mirror coupled to the second sense input.

In various embodiments, the gain stage includes a first current mirror. The configurable current source may include a second current minor and select switches coupled between the second current minor and the conduction terminal of the feedback transistor. In such embodiments, the select switches are coupled to the select input and configured to switch the coupling between the second current minor and the conduction terminal of the feedback transistor based on the select input.

In various embodiments, the diagnostic circuit further includes an overcurrent detection circuit coupled to the output of the gain stage and configured to generate an overcurrent signal based on the output of the gain stage and an overcurrent threshold. In some embodiments, the diagnostic circuit also includes an over load detection circuit coupled to the output of the gain stage and configured to generate an over load signal based on the output of the gain stage and an over load threshold. The diagnostic circuit may further include a minor current transistor with a control terminal coupled to the output of the gain stage that is configured to generate a mirror current based on the output of the gain stage. In such embodiments, the minor current is proportional to the current flowing in the half-bridge switching circuit.

Advantages of various embodiments may include reduced semiconductor layout area usage, reduced cost, and reduced energy consumption in some embodiments. In some embodiments, a further advantage may include sensing both high-side and low-side current in a half-bridge switching circuit using a single measurement circuit coupled to both the high-side and low-side switches that includes a single sense amplifier.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A diagnostic circuit configured to be coupled to an output terminal of a switching circuit and to a sense terminal of a sense circuit coupled in parallel with the switching circuit, the diagnostic circuit comprising:

a configurable feedback circuit configured to be coupled to the output terminal and the sense terminal, wherein the configurable feedback circuit is configured to
      receive a select signal,
      switch a configuration of the configurable feedback circuit between a first mode and a second mode based on the select signal,
      sink a current from the sense circuit in the first mode,
      source a current to the sense circuit in the second mode, and
      balance a voltage difference between the output terminal and the sense terminal in the first mode and in the second mode.

2. The diagnostic circuit of claim 1, further comprising the switching circuit and the sense circuit.

3. The diagnostic circuit of claim 2, wherein
   the switching circuit is a half-bridge switching circuit comprising a high side transistor coupled to a high supply terminal and a low side transistor coupled to a low supply terminal; and
   the sense circuit comprises
      a high side sense transistor coupled to the high supply terminal and configured to receive a same first control signal as the high side transistor, and
      a low side sense transistor coupled to the low supply terminal and configured to receive a same second control signal as the low side transistor.

4. The diagnostic circuit of claim 1, wherein the configurable feedback circuit comprises a single sense amplifier comprising a first input configured to be coupled to the output terminal, a second input configured to be coupled to the sense terminal, and a first output configured to adjust current flowing in the sense circuit.

5. The diagnostic circuit of claim 1, wherein the configurable feedback circuit is further configured to generate a diagnostic output signal proportional to a current flowing in the switching circuit in the first mode and in the second mode.

6. The diagnostic circuit of claim 5, further comprising an overcurrent detection circuit coupled to the configurable feedback circuit and configured to
   generate a first minor current proportional to the current flowing in the switching circuit based on the diagnostic output signal,
   compare the first minor current to an overcurrent threshold, and
   generate an overcurrent signal based on comparing the first minor current to the overcurrent threshold.

7. The diagnostic circuit of claim 5, further comprising an open load detection circuit coupled to the configurable feedback circuit and configured to
   generate a first minor current proportional to the current flowing in the switching circuit based on the diagnostic output signal,
   compare the first minor current to an open load threshold, and
   generate an open load signal based on comparing the first minor current to the open load threshold.

8. The diagnostic circuit of claim 5, wherein the configurable feedback circuit comprises a sense amplifier having differential inputs configured to be coupled to the output terminal and the sense terminal, wherein the sense amplifier is configured to balance the voltage difference between the output terminal and the sense terminal and generate the diagnostic output signal.

9. The diagnostic circuit of claim 8, wherein the sense amplifier comprises an operational transconductance amplifier.

10. The diagnostic circuit of claim 8, wherein the configurable feedback circuit further comprises
a current mirror,
select switches coupled to the current mirror and configured to receive the select signal, and
a feedback transistor coupled to the select switches, wherein the current mirror, select switches, and the feedback transistor are configured to switch the configuration of the configurable feedback circuit, provide the current sink, and provide the current source.

11. A method of operating a switching circuit with a sense circuit coupled in parallel with the switching circuit, the method comprising:
receiving a select signal at a configurable feedback circuit coupled to the switching circuit and the sense circuit;
switching a configuration of the configurable feedback circuit between a first mode and a second mode based on the select signal;
sinking a current from the sense circuit in the first mode;
sourcing a current to the sense circuit in the second mode; and
balancing a voltage difference between an output terminal of the switching circuit and a sense terminal of the sense circuit in the first mode and the second mode.

12. The method of claim 11, further comprising generating a diagnostic output signal proportional to a current flowing in the switching circuit in the first mode and the second mode.

13. The method of claim 12, further comprising generating an overcurrent detection signal based on the diagnostic output signal and an overcurrent threshold.

14. The method of claim 12, further comprising generating an open load detection signal based on the diagnostic output signal and an open load threshold.

15. The method of claim 12, further comprising generating a mirror current proportional to a main current flowing in the switching circuit based on the diagnostic output signal.

16. The method of claim 11, wherein balancing the voltage difference between the output terminal and the sense terminal comprises substantially zeroing the voltage difference between the output terminal and the sense terminal.

17. A diagnostic circuit configured to be coupled to an output terminal of a half-bridge switching circuit and to a sense terminal of a sense circuit coupled in parallel with the half-bridge switching circuit, the diagnostic circuit comprising:
a sense amplifier comprising a first sense input configured to be coupled to the output terminal and a second sense input configured to be coupled to the sense terminal;
a gain stage coupled to a first sense output of the sense amplifier and a second sense output of the sense amplifier;
a crossbar switch coupled between the sense amplifier and the gain stage and coupled to a select input, wherein the crossbar switch is configured to switch the coupling of the sense amplifier and the gain stage based on the select input;
a configurable current source coupled to the sense terminal and the select input, wherein the configurable current source is configured to be controlled based on the select input; and
a feedback transistor having a conduction terminal coupled to the configurable current source and a control terminal coupled to an output of the gain stage, wherein the output of the gain stage is proportional to a current flowing in the half-bridge switching circuit.

18. The diagnostic circuit of claim 17, further comprising the half-bridge switching circuit and the sense circuit.

19. The diagnostic circuit of claim 17, wherein the sense amplifier comprises a fully differential operational transconductance amplifier (OTA).

20. The diagnostic circuit of claim 19, wherein the fully differential OTA comprises bipolar junction transistors (BJTs) configured as a first bipolar current minor coupled to the first sense input and a second bipolar current minor coupled to the second sense input.

21. The diagnostic circuit of claim 19, wherein the gain stage comprises a first current mirror.

22. The diagnostic circuit of claim 21, wherein the configurable current source comprises a second current minor and select switches coupled between the second current mirror and the conduction terminal of the feedback transistor, and wherein the select switches are coupled to the select input and configured to switch the coupling between the second current mirror and the conduction terminal of the feedback transistor based on the select input.

23. The diagnostic circuit of claim 22, further comprising an overcurrent detection circuit coupled to the output of the gain stage and configured to generate an overcurrent signal based on the output of the gain stage and an overcurrent threshold.

24. The diagnostic circuit of claim 22, further comprising an over load detection circuit coupled to the output of the gain stage and configured to generate an over load signal based on the output of the gain stage and an over load threshold.

25. The diagnostic circuit of claim 22, further comprising a minor current transistor having a control terminal coupled to the output of the gain stage and configured to generate a minor current based on the output of the gain stage, wherein the minor current is proportional to the current flowing in the half-bridge switching circuit.

* * * * *